United States Patent [19]

Shin

[11] Patent Number: 5,801,402

[45] Date of Patent: Sep. 1, 1998

[54] VCSEL LIGHT OUTPUT APPARATUS HAVING A MONITORING PHOTODETECTOR AND AN OPTICAL PICKUP APPARATUS EMPLOYING THE SAME

[75] Inventor: Hyun-kuk Shin, Suwon, Rep. of Korea

[73] Assignee: Samsung Electronics Co., Ltd., Kyungki-Do, Rep. of Korea

[21] Appl. No.: 744,320

[22] Filed: Nov. 7, 1996

[30] Foreign Application Priority Data

Jan. 23, 1996 [KR] Rep. of Korea .................. 96-1396

[51] Int. Cl.$^6$ ............................................. H01L 27/15
[52] U.S. Cl. ............................ 257/80; 257/81; 372/50
[58] Field of Search ............................ 257/80, 81, 82, 257/98, 99; 372/50, 92

[56] References Cited

U.S. PATENT DOCUMENTS 5,448,536  9/1995  Muranishi et al. ................ 369/13

OTHER PUBLICATIONS

Patent Abstract of Japan, vol. 010, No. 125 (E–402), May 10, 1986, & JP 60 257584 A (Sharp KK), Dec. 19, 1985, *Abstract, Yorigumi et al.

Patent Abstracts of Japan, vol. 018, No. 570 (E–1623), Oct. 31, 1994, & JP 06 207138 A (Seiko Epson Corp), Jul. 26, 1994, *Abstract, Katsumi.

Patent Abstracts of Japan, vol. 009, No. 234 (E–344), Sep. 20, 1985, & JP 60 088486 A (Matsushita Denki Sangyo KK) May 18, 1995, *Abstract, Masahiro et al.

Patent Abstracts of Japan, vol. 016, No. 035 (P–1304), Jan. 28, 1992, & JP 03 242838 A (Matsushita Electric Ind Co Ltd), Oct. 29, 1991, *Abstract, Makoto.

Patent Abstracts of Japan, vol. 017, No. 132 (P–1504), Mar. 18, 1993 & JP 04 311828 A (Hitachi Ltd), Nov. 4, 1992, *Abstract, Shigeru et al.

International Conference of Solid State Devices and Materials, Aug. 1, 1992, pp. 595–597, XP000312274, Hideo Kosaka et al.: "Pixels Consisting of Double Vertical–Cavity Detector and Single Vertical–Cavity Laser Sections For 2–D Bidirectional Optical Interconnections".

*Primary Examiner*—Minh-Loan Tran
*Attorney, Agent, or Firm*—Sughrue, Mion, Zinn, Macpeak & Seas, PLLC

[57] ABSTRACT

A light output apparatus and an optical pickup apparatus employing the same are provided. The light output apparatus includes a base, a VCSEL installed on the base for emitting light in a direction normal to the base, and a light output controller for controlling the light output of the VCSEL. The light output controller includes a monitoring photodetector and a housing enclosing the VCSEL and the photodetector. The housing incorporates a projector window for transmitting most of the light emitted from the VCSEL and reflecting some of the light back onto the base. The monitoring photodetector is installed on the base for receiving some of the light emitted from the VCSEL and reflected from the projector window, and converting the light into an electrical signal. A plurality of lead pins are connected to the VCSEL and the monitoring photodetector to facilitate connection to a power supply-and transmission of the electrical signals. In addition to the above, the optical pickup apparatus includes an object lens for concentrating the light on an optical recording medium by collecting light emitted from the VCSEL, a light path changing unit for changing the path of light reflected from the light record medium, and another photodetector for receiving the reflected light and converting it into an electrical signal to be fed to an error detection circuit.

12 Claims, 7 Drawing Sheets

VCSEL LIGHT OUTPUT APPARATUS HAVING A MONITORING PHOTODETECTOR AND AN OPTICAL PICKUP APPARATUS EMPLOYING THE SAME

BACKGROUND OF THE INVENTION

The present invention relates to a vertical cavity surface emitting laser (VCSEL) light output apparatus and an optical pickup apparatus employing the same. More particularly, the present invention relates to a VCSEL light output apparatus having a monitoring photodetector to control the intensity of the light emitted from the VCSEL.

Generally, a VCSEL which is used as a light source is formed of a first reflector stack, an active region, a second reflector stack, and an electrode layer, stacked one on top of the other. The first reflector stack is formed of at least one n-type semiconductor material and the second reflector stack is formed of at least one p-type semiconductor material. The active region generates a laser beam during the application of a forward biased voltage to the electrode layer. This laser beam is resonated between the first and second reflector stacks, and is emitted in a direction perpendicular to the surface of the stack. Because the light emitted from the VCSEL has the characteristics of being almost circular, being highly dense, and operating in a single mode, the VCSEL is widely used in optical applications such as optical pickup apparatuses and computers.

However, because of the emission characteristics of the VCSEL, it is difficult to install a monitoring photodetector to receive some of the light emitted from the VCSEL and control the light output of the VCSEL. The difficulty is due to the fact that the VCSEL emits light in a direction vertical to the upper surface thereof, and because the lower surface thereof is mounted on a semiconductor base. Therefore, unless the monitoring photodetector is installed in the light path of the VCSEL, it will receive little in amount of the emitted light.

A mechanism aimed at solving this problem is disclosed in U.S. Pat. No. 5,285,466 entitled Feedback Mechanism for Vertical Cavity Surface Emitting Lasers. This mechanism, described herein with reference to FIGS. 1 and 2, includes a VCSEL 12 which emits light when a forward biased voltage is applied, and a ring patterned monitoring photodetector 14 installed around the VCSEL 12 to receive light emitted horizontally from the VCSEL 12. The monitoring photodetector 14 has a stack structure which is identical or similar to that of the VCSEL 12, and is capable of operating as a light detector when a reverse biased or no bias voltage is applied to the electrode layer formed on the respective upper and lower surfaces.

The monitoring photodetector 14 controls the quantity of light emitted from the VCSEL 12 by receiving horizontally emitted light emitted therefrom, and then converting it into an electrical signal and feeding it back to the electrode of the VCSEL 12.

Light vertically emitted from the VCSEL 12 is generated by forward biased lasing currents in the mA range. As shown in FIG. 2, the current 24, due to the vertically emitted light detected by the monitoring photodetector 14, has a lasing threshold point 20 where the quantity of light is sharply increased, and a lasing termination point 22 where the quantity of light is sharply decreased. When the lasing currents between the lasing threshold 20 and lasing termination point 22 are applied, output currents of several microamperes are produced by the photodetector 14. When the lasing currents outside the range are applied, the currents detected from the monitoring photodetector 14 are negligible.

The currents 34 due to horizontally emitted light are relatively small compared to those due to vertically emitted light 24. Also, the lasing threshold point 30 and lasing termination point 32 of the currents due to horizontally emitted light 34 are not clearly defined. The currents 34 due to horizontally emitted light increase relatively slowly up to around point 32, and then decrease slowly.

The fact that the detected currents due to horizontally emitted light are not proportional to those due to vertically emitted light means that the quantity of horizontally emitted light is not proportional to that of vertically emitted light. Therefore, it is impossible to precisely control the quantity of vertically emitted light based on the detected horizontally emitted light. Also, since much of the horizontally emitted light is transmitted through the monitoring photodetector 14, it is difficult to obtain a sufficient amount of the horizontally emitted light necessary to detect a signal for controlling the amount of vertically emitted light.

SUMMARY OF THE INVENTION

It is an object of the present invention to provide a light output apparatus and an optical pickup apparatus employing the same, capable of effectively controlling the quantity of light emitted from a VCSEL on the basis of the quantity of vertically emitted light.

To achieve one aspect of the above object, there is provided a light output apparatus comprising a base and a VCSEL installed on the base, for emitting light in a direction normal to the base. A light output controlling means is provided for controlling the light output of the VCSEL, wherein the light output controlling means is comprised of a monitoring photodetector and a housing formed to enclose the VCSEL and the monitoring photodetector. The housing incorporates a projector window for transmitting most of the light emitted from the VCSEL and reflecting some of the light back onto the base. The monitoring photodetector is installed on the base for receiving some of the light emitted from the VCSEL and reflected from the projector window, and converting the light into an electrical signal. A plurality of lead pins, connected to the VCSEL and the monitoring photodetector, are used for connecting a power supply and transmitting the electrical signals.

To achieve other aspects of the above object, there is provided an optical pickup apparatus employing a light output apparatus. A VCSEL is installed on a base for emitting light in a direction normal to the base. A light output controlling means is provided for controlling the light output of the VCSEL. An object lens is utilized for forming a light spot on an optical recording medium by collecting light emitted from the VCSEL. A light path changing means is provided for changing the path of light reflected from the optical recording medium, and a main photodetector is used for receiving the reflected light and detecting an error signal and an information signal. The light output controlling means comprises a housing formed to enclose the VCSEL, the housing having a projector window for transmitting most of the light emitted from the VCSEL and reflecting some of the light back onto said base. A monitoring photodetector is utilized for monitoring and is installed on the base for receiving some of the light emitted from the VCSEL and reflected from the projector window. The monitoring photodetector converts the received light into an electrical signal. A plurality of first lead pins are connected to the VCSEL and the monitoring photodetector to provide a connection to a power supply and facilitate transmission of the electrical signal of the monitoring photodetector.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
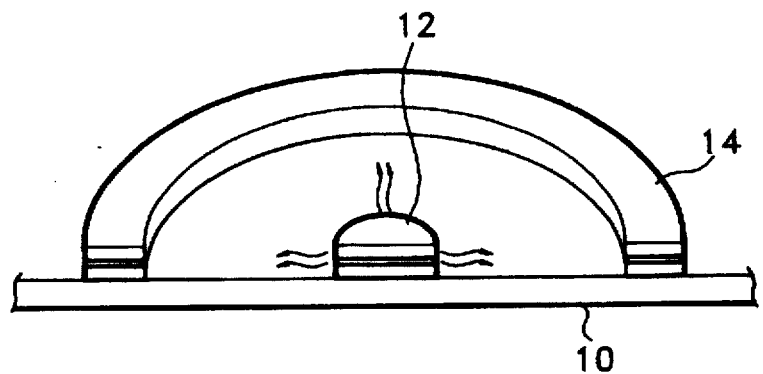
FIG. 1 is a schematic view of a conventional light output apparatus.
Figure 2:
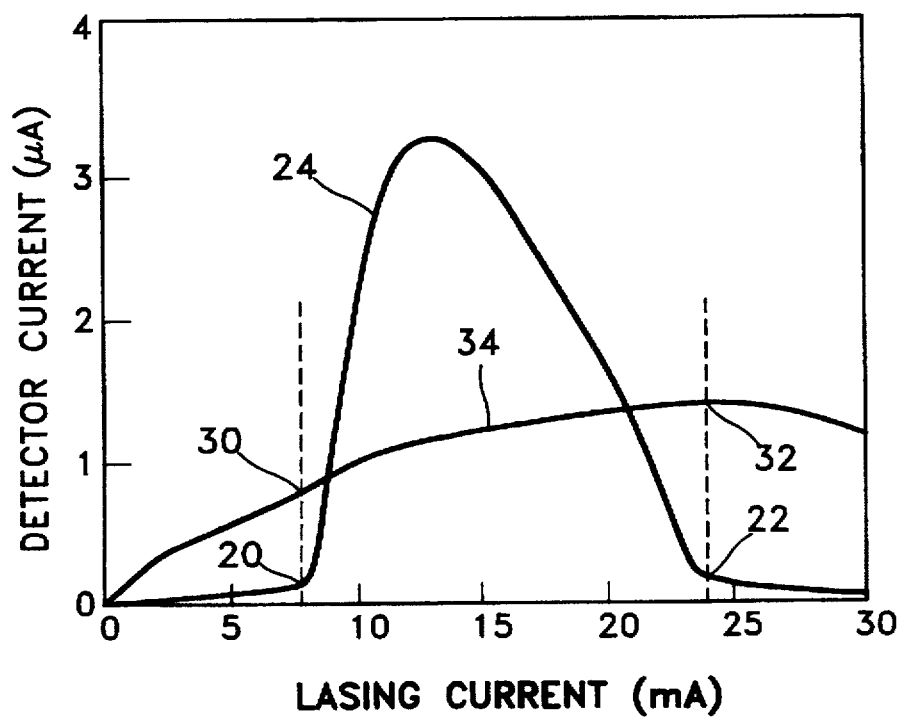
FIG. 2 is a graph showing detected currents due to vertically and horizontally emitted light output from the light output apparatus of FIG. 1.
Figure 3:
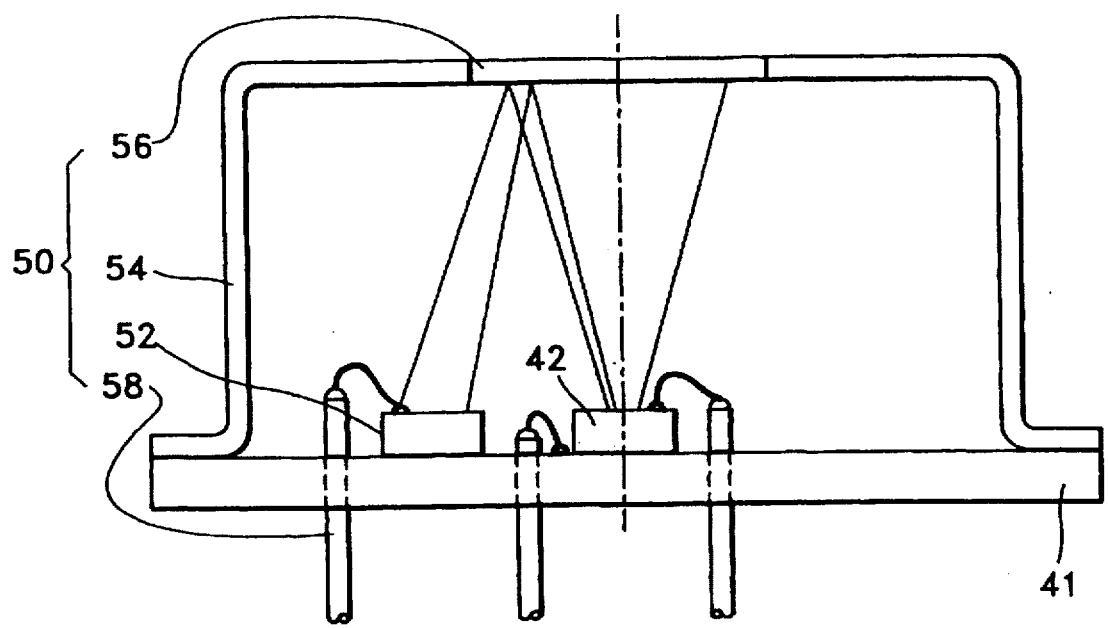
FIG. 3 is a schematic sectional view of an embodiment of the light output apparatus according to the present invention.

As shown in FIG. 3, a light output apparatus according to the present invention comprises a base 41, a VCSEL 42 formed or mounted on the base 41, and a light output controller 50 for controlling the light output of the VCSEL 42. The VCSEL 42 emits light in a direction perpendicular to the upper surface thereof. The light output controller 50 is comprised of a monitoring photodetector 52, a housing 54 having a projector window 56, and a plurality of lead pins 58.

The housing 54 is installed on the base 41 to enclose the VCSEL 42 and the monitoring photodetector 52. The projector window 56 is installed in the path of the light emitted from the VCSEL 42. Most of the light emitted from the VCSEL 42 is transmitted through the projector window 56 and the rest is reflected off of the projector window 56.

The monitoring photodetector 52, installed on the base 41 whereon the VCSEL 42 is installed, receives light reflected from the projector window 56. At this time, since the monitoring photodetector 52 receives some of the vertical light, the quantity of the received light is proportional to that of the light emitted from the VCSEL 42.

The monitoring photodetector 52 has the same structure as that of the VCSEL 42 and is preferably capable of detecting incident light by being reverse biased.

The lead pins 58 connect an external power source to the VCSEL 42 and the monitoring photodetector 52, and transmit electrical signals detected from the monitoring photodetector 52 outward. These lead pins 58 pass through the base 41 and are connected to the monitoring photodetector 52, the VCSEL 42, and the base 41 in the housing 54.

Figure 4:
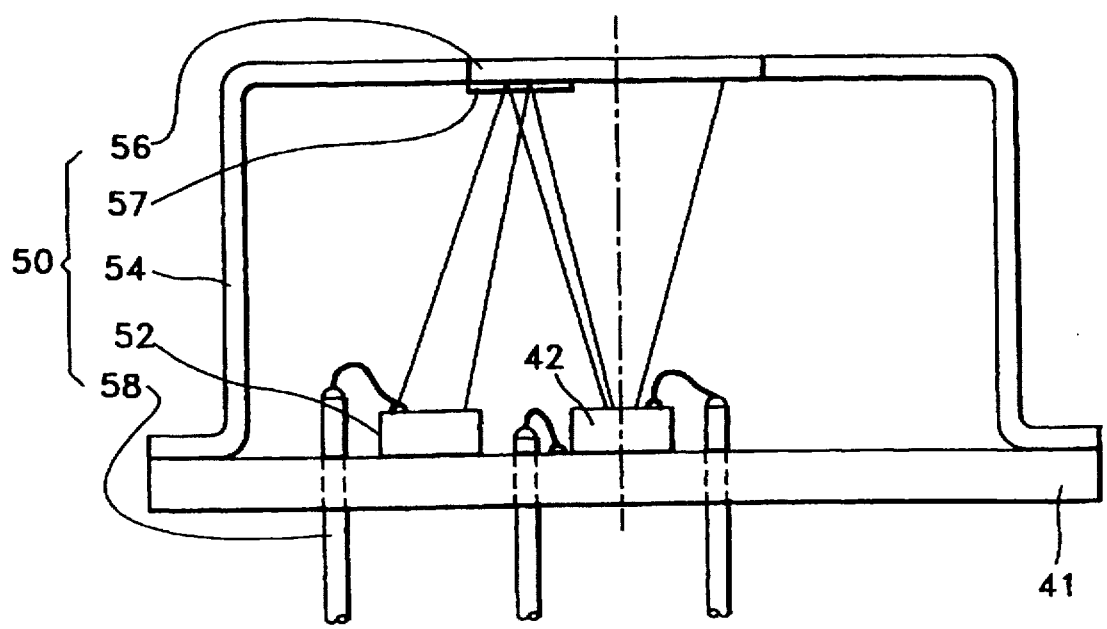
FIG. 4 is a schematic sectional view of another embodiment of the light output apparatus according to the present invention.

FIG. 4 is a sectional view showing another embodiment of the light output apparatus according to the present invention. Here, the reference numerals identical to those of FIG. 3, indicate similar or identical portions having similar or identical functions.

As shown in FIG. 4, a reflective coating 57 is formed on a predetermined portion of the projector window 56 to increase the quantity of light reflected from the projector window 56 to the monitoring photodetector 52. This reflective coating 57 is formed of a highly reflective metal, namely, Au or Ag, etc. The projector window 56 reflects about 5 to 6% of the light emitted from the VCSEL 42 without the reflective coating 57, and about 50 to 60% with the reflective coating. Therefore, enough light can be received by the monitoring photodetector 52 to generate electrical signals for controlling light output of the VCSEL 42.

Now, a first embodiment of the optical pickup apparatus employing the light output apparatus according to the present invention will be described with reference to FIGS. 5 and 6.

Figure 5:
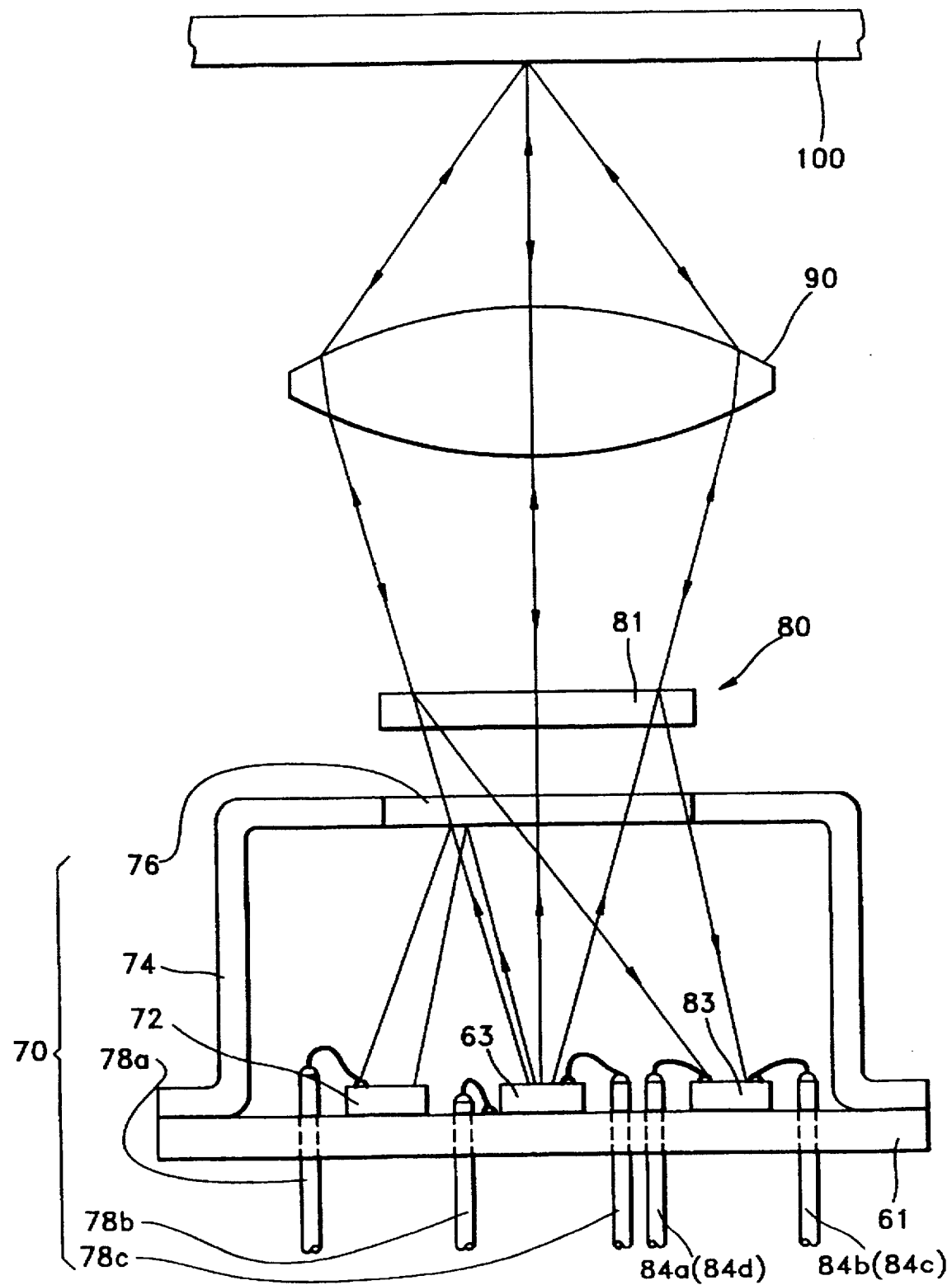
FIG. 5 is a schematic sectional view of a first embodiment of an optical pickup apparatus employing the light output apparatus according to the present invention.
Figure 6:
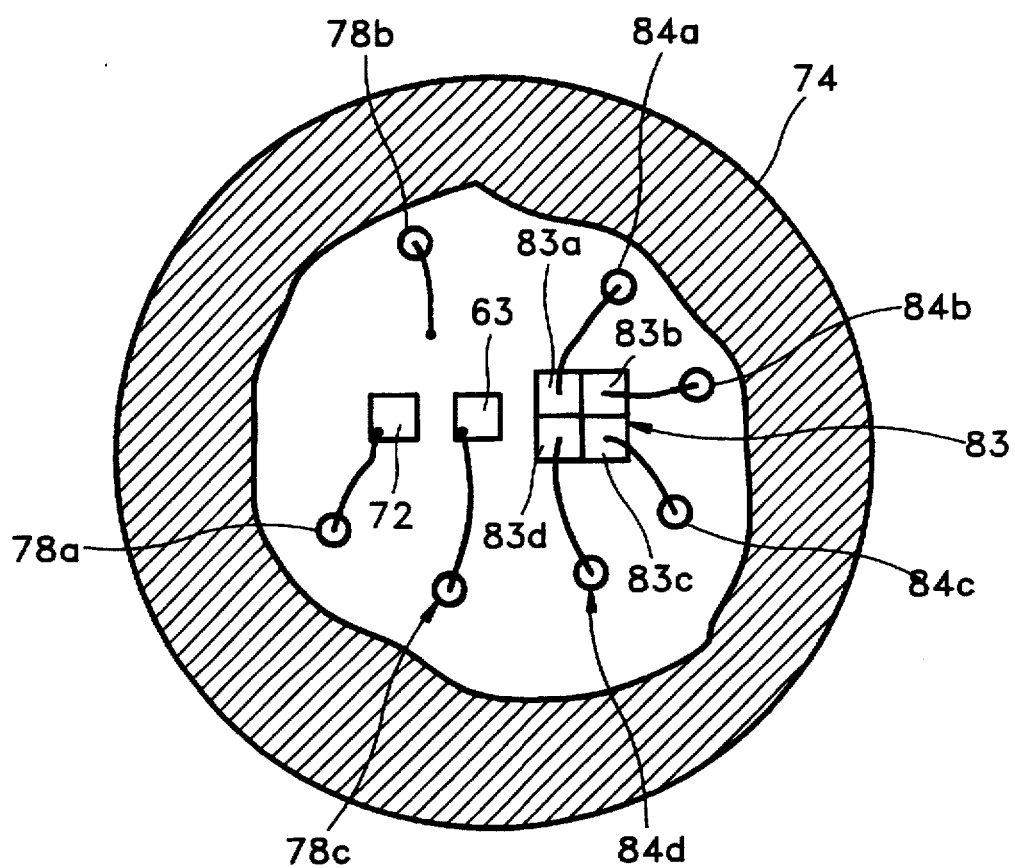
FIG. 6 is a partially cutaway plan view showing the interior of the housing of the optical pickup apparatus shown in FIG. 5.

As shown in FIG. 5, the optical pickup apparatus is comprised of a base 61 and a VCSEL 63 formed on the base 61, for emitting a laser beam. A light output controller 70 is provided for controlling the light output of the VCSEL 63. An object lens 90 is arranged on an optical axis between the VCSEL 63 and an optical recording medium 100, for collecting an incident beam and concentrating the light on the optical recording medium 100. A main photodetector 83 is for receiving the light reflected from the optical recording medium 100 and detecting an information signal and an error signal therefrom. A light path changing portion 80 directs the light reflected from the optical recording medium 100 to the main photodetector 83.

The light output controller 70 is comprised of a monitoring photodetector 72, a housing 74 having a projector window 76, and first lead pins 78a, 78b, and 78c. The operations of the VCSEL 63 and the light output controller 70 are the same as mentioned above.

The main photodetector 83 is installed on the base 61 whereon the VCSEL 63 is installed. This main photodetector 83 preferably comprises four separate photodetectors 83a, 83b, 83c, and 83d (shown in FIG. 6) for independently receiving light and converting it into electrical signals. Four second lead pins 84a, 84b, 84c, and 84d installed inside of the housing 74, pass through the base 61 and transmit the electrical signals detected from the main photodetector 83 out of the housing 74. The second lead pins 84a, 84b, 84c, and 84d are electrically connected to the four separate photodetectors 83a, 83b, 83c, and 83d of the main photodetector 83, respectively, and an error detection circuit portion (not shown) for detecting radio frequency signals, tracking error signals, and focus error signals.

The light path changing portion 80 is arranged in the light path between the projector window 76 and the object lens 90, and preferably has a hologram device 81 for diffracting and collecting light reflected from the optical recording medium 100 and directing it to the main photodetector 83. The light path changing portion 80 may be a common beam splitter. In this case, the main photodetector 83 is preferably installed outside of the housing 74. In the present invention, the main photodetector 83 is comprised of four separate photodetectors but can be comprised of two or six photodetectors as occasion demands.

A second embodiment of the optical pickup apparatus employing the light output apparatus according to the present invention will now be described with reference to FIG. 7.

As shown, a reflective coating 77 is formed on a predetermined portion of a projector window 76 to increase the quantity of light reflected from the projector window 76 to a second monitoring photodetector 72. Generally, this reflective coating 77 is formed of a highly reflective metal, namely, Au or Ag, etc. Here, the portions which are not described are similar or identical to the portions having the identical reference numerals described in the first embodiment of the present invention referred to in FIGS. 5 and 6.

Figure 8:
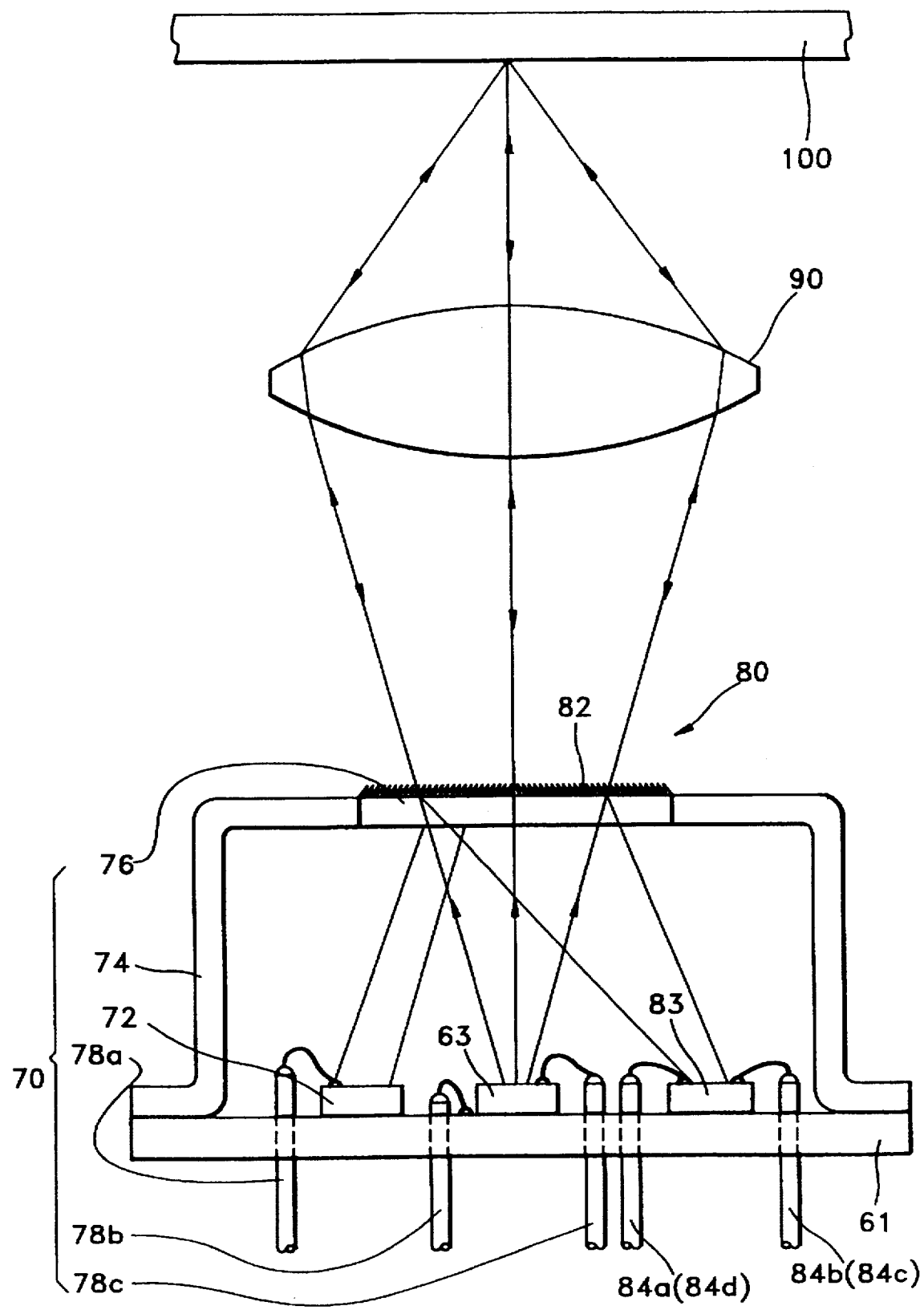
FIG. 8 is a schematic sectional view showing a third embodiment of the optical pickup apparatus employing the optical pickup apparatus according to the present invention.

A third embodiment of the optical pickup apparatus employing the light output apparatus according to the present invention will now be described with reference to FIG. 8.

As shown, a hologram pattern 82 is formed on an upper surface of a projector window 76 as a light path changing portion 80. The hologram pattern 82 diffracts light reflected from the optical recording medium 100 and concentrates it on the main photodetector 83 formed on the base 61. The optical pickup apparatus can be made more compact by forming a hologram pattern 82 on the upper surface of the projector window 76 rather than by employing a separate hologram device 81 (shown in FIG. 7) as a light path changing portion 80. The portions which are not described are similar or identical to the portions having the identical reference numerals described in the first embodiment of the present invention provided with reference to FIGS. 5 and 6.

Figure 9:
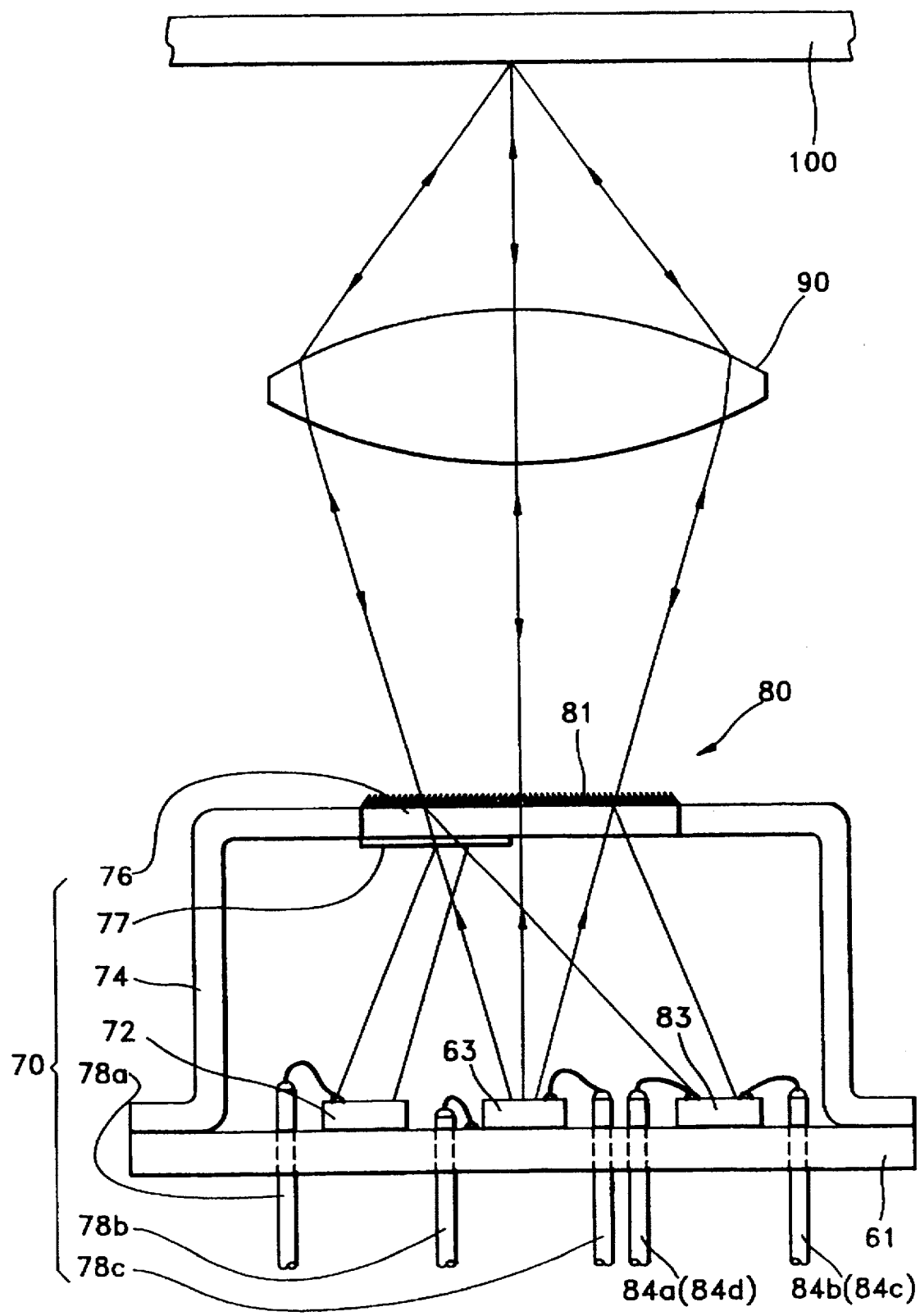
FIG. 9 is a schematic sectional view showing a fourth embodiment of the optical pickup apparatus employing the light output apparatus according to the present invention.

A fourth embodiment of the optical pickup apparatus employing the light output apparatus according to the present invention will now be described with reference to FIG. 9.

Figure 7:
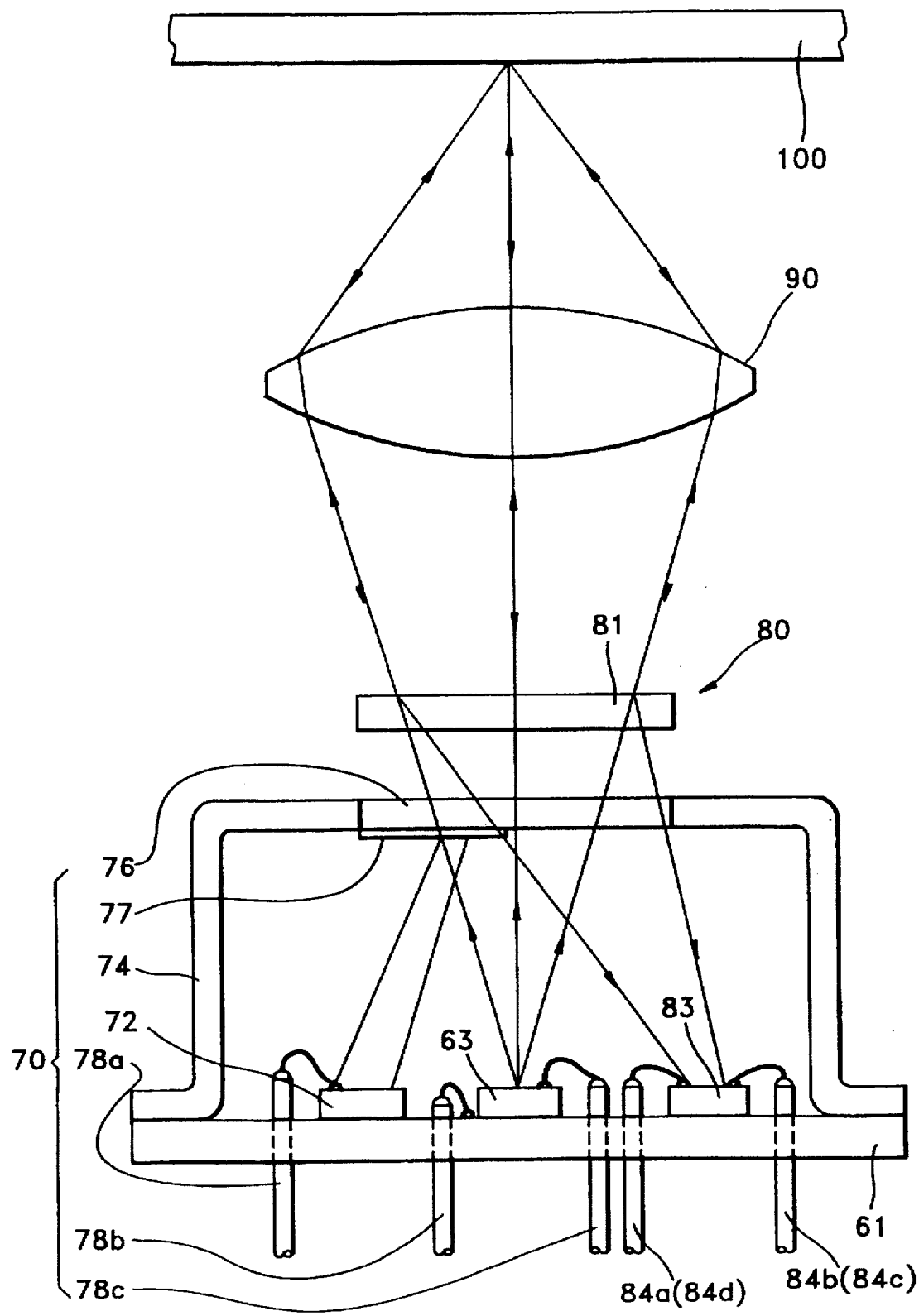
FIG. 7 is a schematic sectional view showing a second embodiment of the optical pickup apparatus employing the light output apparatus according to the present invention.

As shown, a reflective coating 77 shown in FIG. 7 is formed on a predetermined portion of an inner surface of a projector window 76 to increase the quantity of light reflected from the projector window 76 to a monitoring photodetector 72. Also, a hologram pattern shown in FIG. 8 is formed on an upper surface of the projector window 76. The functions and operations of the reflective coating 77 and hologram pattern 82 are the same as described above. The portions which are not described are similar or identical to the portions having the identical reference numerals described with reference to FIGS. 5 to 8.

As described above, the light output apparatus according to the present invention detects some of the vertically emitted light emitted from the VCSEL 63 with a monitoring photodetector and controls the light output more precisely based on the detected light. The amount of reflected vertical light can be controlled by the size and reflectivity of the reflective coating. Alternately, a mirror which is independent of the projector window can be situated inside the housing.

Furthermore, the optical pickup apparatus employing the light output apparatus according to the present invention can precisely control the quantity of light emitted from the VCSEL 63 by receiving light which is proportional to the quantity of light emitted from the VCSEL 63. Also, easy assembly and compactness can be achieved by forming the hologram device on the projector window of the housing.

What is claimed is:

1. A light output apparatus, comprising:
    a base;
    a vertical cavity surface emitting laser (VCSEL) directly installed on the base for emitting light in a direction normal to the base; and
    light output controlling means for controlling the light output of the VCSEL,
    wherein said light output controlling means is comprised of:
        a housing enclosing the VCSEL, said housing having a projector window for transmitting most of the light emitted from the VCSEL and reflecting some of the light back onto said base;
        a monitoring photodetector installed on the base for receiving some of the light emitted from the VCSEL and reflected from the projector window, and converting the light into an electrical signal; and
        a plurality of lead pins, connected to the VCSEL and the monitoring photodetector, for connecting the apparatus to a power supply and transmitting the electrical signal from the photodetector.

2. A light output apparatus as claimed in claim 1, further comprising a reflective coating formed on a portion of the inner surface of said projector window.

3. A light output apparatus as claimed in claim 1, wherein said monitoring photodetector has an identical structure to that of the VCSEL and is reverse biased so as to detect incident light.

4. An optical pickup apparatus, comprising:
    a light output apparatus comprising:
        a base;
        a vertical cavity surface emitting laser (VCSEL) directly installed on the base for emitting light in a direction normal to the base; and
        light output controlling means for controlling the light output of the VCSEL,
        wherein said light output controlling means is comprised of:
            a housing enclosing the VCSEL, said housing having a projector window for transmitting most of the light emitted from the VCSEL and reflecting some of the light back onto said base;
            a monitoring photodetector installed on the base for receiving some of the light emitted from the VCSEL and reflected from the projector window, and converting the light into an electrical signal; and
            a plurality of lead pins, connected to the VCSEL and the monitoring photodetector, for connecting the apparatus to a power supply and transmitting the electrical signal from the photodetector;
    an object lens for concentrating light on an optical recording medium by collecting light from the VCSEL;
    a light path changing means for changing the path of light reflected from the optical recording medium; and
    a main photodetector for receiving said reflected light and detecting an error signal and an information signal.

5. An optical pickup apparatus as claimed in claim 4, further comprising a reflective coating formed on a portion of the inner surface of said projector window.

6. An optical pickup apparatus as claimed in claim 4, wherein said main photodetector is arranged on the base.

7. An optical pickup apparatus as claimed in claim 6, further comprising at least one second lead pin electrically connected to said main photodetector, for transmitting electrical signals.

8. An optical pickup apparatus as claimed in claim 6, wherein said main photodetector comprises four separate photodetectors for independently receiving light and converting said received light into electrical signals.

9. An optical pickup apparatus as claimed in claim 8, further comprising at least one second lead pin electrically connected to said main photodetector, for transmitting electrical signals.

10. An optical pickup apparatus as claimed in claim 4, wherein said light path changing means comprises a hologram device installed in the light path between said projector window and said object lens.

11. An optical pickup apparatus as claimed in claim 4, wherein said light path changing means comprises a hologram pattern formed on an upper surface of the projector window.

12. An optical pickup apparatus as claimed in claim 4, wherein said monitoring photodetector has an identical structure to that of the VCSEL and functions to receive incident light by being reverse biased.

* * * * *